(12) United States Patent
Ronwin

(10) Patent No.: US 7,078,612 B1
(45) Date of Patent: Jul. 18, 2006

(54) PHOTON BATTERY

(76) Inventor: Edward Ronwin, 945 Rolland Moore Dr., L-2, Fort Collins, CO (US) 80526

( * ) Notice: Subject to any disclaimer, the term of this patent is extended or adjusted under 35 U.S.C. 154(b) by 0 days.

(21) Appl. No.: 11/323,406

(22) Filed: Dec. 31, 2005

(51) Int. Cl.
*H01L 25/00* (2006.01)

(52) U.S. Cl. ..................................... 136/246

(58) Field of Classification Search ............... 136/246; 250/216, 228
See application file for complete search history.

(56) References Cited

U.S. PATENT DOCUMENTS

| | | | |
|---|---|---|---|
| 4,154,219 A | 5/1979 | Gupta et al. | |
| 4,257,676 A | 3/1981 | Greubel et al. | |
| 5,500,054 A | 3/1996 | Goldstein | |
| 5,575,860 A | 11/1996 | Cheney | |
| 5,709,456 A | 1/1998 | Smith et al. | |
| 5,772,792 A | 6/1998 | Zimmermann | |
| 5,877,874 A | 3/1999 | Rosenberg | |
| 5,879,472 A * | 3/1999 | Ronwin | 136/246 |
| 6,059,438 A | 5/2000 | Smith et al. | |
| 6,285,816 B1 | 9/2001 | Anderson et al. | |
| 6,373,623 B1 * | 4/2002 | Ohshima et al. | 359/341.3 |
| 6,957,650 B1 | 10/2005 | Nyhart et al. | |

* cited by examiner

*Primary Examiner*—Alan Diamond
*Assistant Examiner*—Jeffrey Barton

(57) ABSTRACT

The invention is a photon battery device for converting concentrated light into electricity. Daylight is focused into numerous individual optical waveguides which feeds the light into a Faraday Isolator which polarizes the light and prevents it from exiting the first end of the Faraday Isolator. At the second end, a large chamber collects the light where it passes a magnetic field to alter its polarization angle to prevent its reentry into the Faraday Isolator. At the second end of the large light confinement chamber the polarized light will be able to pass into the first end of a smaller light confinement chamber where a second magnetic force alters the angle of polarization so that the light will be able to be directed onto an array of optical waveguides which will focus the light onto a series of photovoltaic cells from which electricity emanates for use.

11 Claims, 1 Drawing Sheet

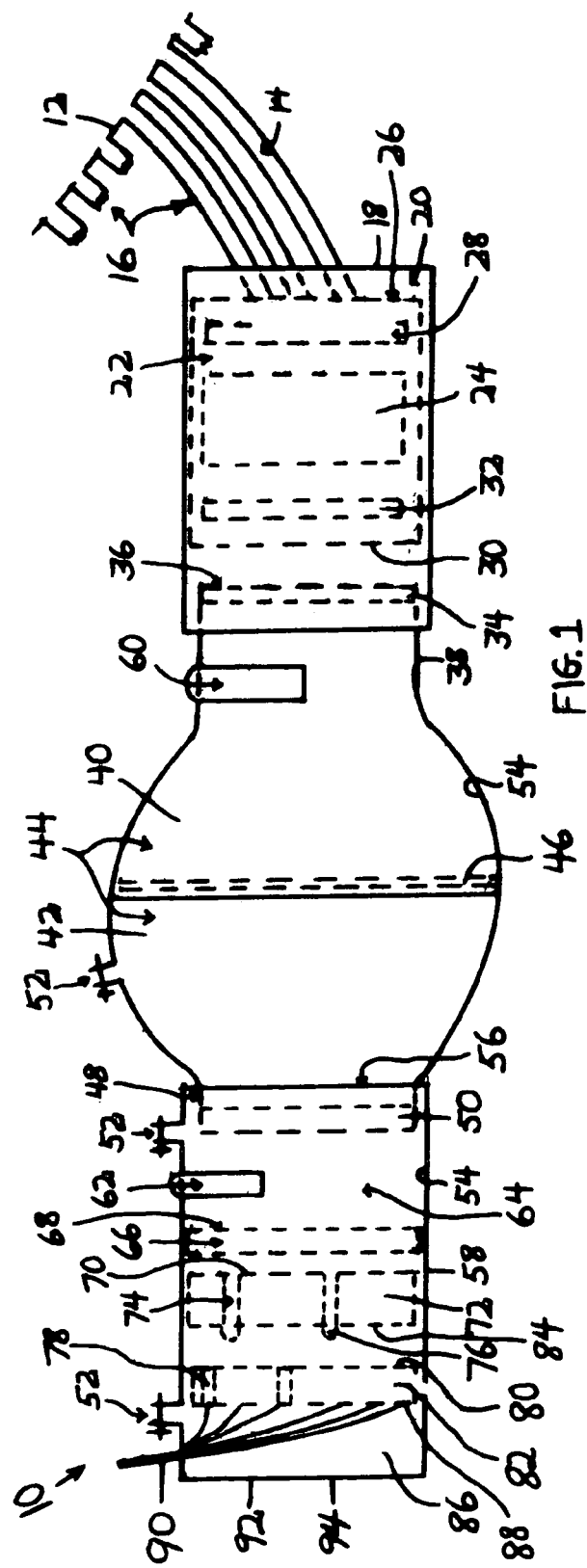
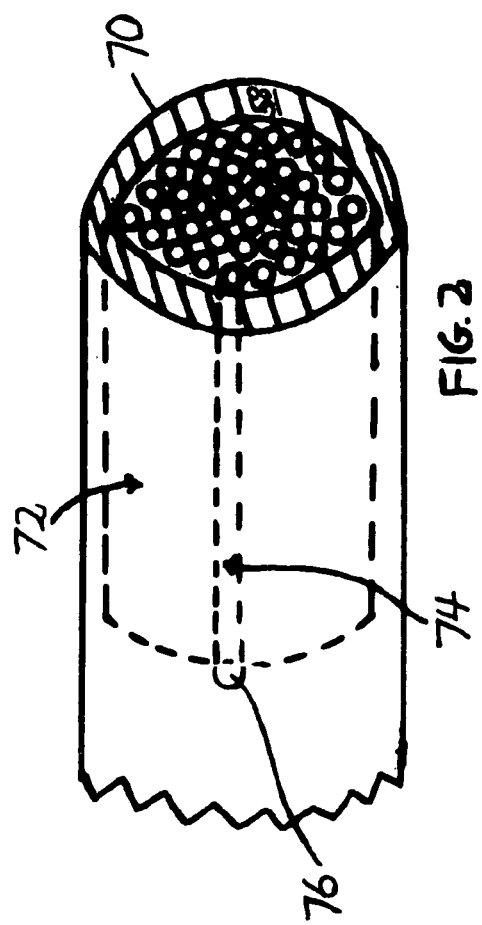
FIG. 1
FIG. 2

US 7,078,612 B1

PHOTON BATTERY

CROSS REFERENCE TO RELATED APPLICATIONS

This application contains subject matter related to that disclosed in applicant's prior utility patent No. 5,879,472, dated Mar. 9, 1999; but does not claim priority therefrom.

BACKGROUND OF THE INVENTION

1. Field of the Invention

The present invention is cognate to applicant's earlier patent, U.S. Pat. No. 5,879,472, which is incorporated herein by this reference, and relates to how and what the prior invention does. Specifically, the present invention relates to a light-confining photon battery device for converting concentrated light ultimately brought to bear on photovoltaic cells for conversion into electric energy.

2. Description of the Relevant Art

The use of photovoltaic cells is known in the prior art. More specifically, photovoltaic devices heretofore devised and utilized are known to consist basically of familiar, expected and obvious structural configurations, notwithstanding the myriad of designs encompassed by the crowded prior art which have been developed for the fulfillment of countless objectives and requirements.

Known prior art photovoltaic devices include U.S. Pat. No. 2,444,442; U.S. Pat. No. 3,447,462; U.S. Pat. No. 4,999,060; U.S. Pat. No. 4,892,409; U.S. Pat. No. 3,097,563; U.S. Pat. No. 4,911,257; U.S. Pat. No. 5,059,254; U.S. Pat. No. 4,987,729; U.S. Pat. No. 4,150,898, and U.S. Pat. No. 1,897,219.

While these devices fulfill their respective, particular objectives and requirements, the aforementioned patents do not disclose a new photon battery device. In particular, the aforementioned devices do not disclose an apparatus for concentrating light for conversion to electrical energy. While U.S. Pat. No. 6,957,650 B2 alleges to be a device for concentrating light for conversion to electrical energy, its approach differs significantly from the instant invention and uses the basic concept underlying applicant's earlier patent; i.e., a collection of light which is concentrated in a compartment and then freed from the compartment toward photovoltaic cells.

Other prior art devices utilize chemically-based batteries which supply electricity to power various devices. While those batteries have found many applications, they are characterized by many deficiencies and shortcomings including gradual deterioration of the chemical components, particularly on frequent use and recharge.

In these respects, the photon battery device according to the present invention substantially departs from the conventional concepts and designs of the prior art, and in so doing provides an apparatus primarily developed for the purpose of converting concentrated light into electricity.

SUMMARY OF THE INVENTION

In view of the foregoing disadvantages inherent in the known types of photovoltaic devices now present in the prior art, the present invention provides for the construction of a new photon battery device which can be utilized for converting concentrated light into electricity. In particular, the invention is a device which uses concentrated light energy rather than chemical energy and utilizes captured photon densities above those available from average, incidental sunlight at its maximum photon density at the earth's surface. The concentrated light is later used in aliquots which are aimed at photovoltaic cells to generate electricity.

The general purpose of the present invention, which will be described subsequently in detail, is to provide a new apparatus and method for a photon battery device which has many advantages of the photovoltaic devices mentioned heretofore and many novel features that result in a new photon battery device which is not anticipated, rendered obvious, suggested, or even implied by any of the prior art photovoltaic devices, either alone or in any combination thereof.

To attain this, the present invention generally provides for interaction of concentrated light with photovoltaic cells, by collecting the light from a light collection disk which is funneled through optical waveguides to a Faraday Isolator where the light is polarized and prevented from exiting the Faraday Isolator in the direction from which it entered. The polarized light in the Faraday Isolator can then move to a larger light confinement chamber wherein magnetic force changes the polarized angle of the light and contains the light but also allows the light to enter a circular birefringent lens and thence into a smaller confinement chamber wherein the application of a magnetic force will change the polarization angle so as to allow the light to enter a series of optical waveguides whose ends are tipped with lenses that will direct the light from each waveguide onto a specific photovoltaic cell wherein electricity will be generated and collated from each cell for distribution to users.

There has thus been outlined, rather broadly, the more important features of the invention in order that the detailed description thereof that follows may be better understood, and in order that the present contributions to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception upon which this discourse is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the attached abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the application of the invention, which is measured by the claims, nor is it intended to be limiting as to the scope of the invention in any way.

It is therefore an object of the present invention to provide an apparatus for a new photon battery device and method which has many of the advantages of the photovoltaic devices mentioned heretofore and many novel features that result in a new photon battery device which is not anticipated, rendered obvious, suggested, or even implied by any of the prior art photovoltaic devices, either alone or in any combination thereof.

It is another object of the present invention to provide a new photon battery device which may be easily and efficiently manufactured and marketed.

It is a further object of the present invention to provide a new photon battery device which is of a durable and reliable construction.

An even further object of the present invention is to provide a new photon battery device which is amenable to low cost manufacture with regard to both materials and labor and, accordingly is amenable to low sale prices to the consuming public, thereby making such photon battery device economically available to the buying public.

Yet another object of the present invention is to provide a new apparatus for a photon battery device and some of the advantages of the methods of the prior art, while simultaneously overcoming some of the disadvantages normally associated therewith.

Still another object of the present invention is to provide a new photon battery device for converting concentrated light into electricity.

Yet another object of the present invention is to provide a new photon battery device which includes a light collection disk from which, by way of optical waveguides, light passes into a sleeve and thence into a Faraday Isolator where it is polarized, prevented from exiting in the direction from which it entered the Faraday Isolator but can then move into a large light confinement chamber where its polarization angle is changed and from which chamber the light can then enter into a smaller light confinement chamber where its polarization angle can again be changed so as to allow a controlled amount of the light to enter into a series of optical waveguides tipped by lenses each of which will direct the light onto a specific photovoltaic cell thus causing the creation of an electric current from each cell which, in turn, will be collected and sent to electricity users.

These together with other objects of the invention, along with the various features of novelty which characterize the invention are pointed out with particularity in the claims annexed to and forming a part of this disclosure. For a better understanding of the invention, its operating advantages and the specific objects attained by its uses, references should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 1 is a side view of a new photon battery device according to the present invention.

FIG. 2 is a cross sectional view of the optical waveguide arrangement that extends between the smaller light confinement chamber and an array of photovoltaic cells.

DESCRIPTION OF THE PREFERRED EMBODIMENT

With reference to the drawings, FIGS. 1 and 2, a new photon battery device embodying the principles and concepts of the present invention and generally designated by the reference numeral 10 will be described.

As best illustrated in FIGS. 1 and 2, the photon battery device 10 for converting concentrated light into electricity comprises a light collection disk 12, a first array of waveguides 16, a first sleeve 20 containing a Faraday Isolator 22 and the first neck 38 of a large light confinement chamber 44. The large light confinement chamber 44 is assembled from two halves 40,42 joined together by air-tight mechanism such as a male and female threads 46. The large confinement chamber 44 has at its first end 36 in its first neck 38 a first circular birefringent lens 34 and in its second neck 48 a second circular birefringent lens 50. A first magnet 60 is positioned over part of the first neck 38 of the large light confinement chamber 44. A second sleeve 58 attaches at its first end 56 to the second neck 48 of the large light confinement chamber 44. Toward the first end 56 of the second sleeve 58, a second magnet 62 sits over the second sleeve 58. The small light confinement chamber 64 occupies the area between the second circular birefringent lens 50 in the second neck 48 of the large light confinement chamber 44 and the polarizing lens 66 at the second end 68 of the small light confinement chamber 64. Flush up to the polarizing lens 66 is the first end 70 of a second array of optical waveguides 72 consisting of a plurality of individual waveguides 74. The second end 84 of each waveguide 74 in the second array of waveguides 72 is tipped with a lens 76 which focuses light on a specific photovoltaic cell 78 all at the first end 80 of the array of photovoltaic cells 82 situated at the second end 84 of the second array of optical waveguides 72. There is an electricity collection chamber 86 at the second end 88 of the array of photovoltaic cells 82 wherein the electricity generated at each photovoltaic cell 78 in the array of photovoltaic cells 82 is collected and sent by lines 90 to users. A complete seal 92 is positioned at the second end 94 of the second sleeve 58.

The Faraday Isolator 22 in the first sleeve 20 contains a Faraday Rotator 24, a first polarizing lens 28 at the first end 26 of the Faraday Isolator 22 and a second polarizing lens 32 at the second end 30 of the Faraday Isolator 22.

In addition, there are three high vacuum ball valves 52 in the photon battery device 10; one of which is positioned as part of the large light confinement chamber 44, another positioned as part of the small light confinement chamber 64 which is in the first end 56 of the second sleeve 58 and the third valve positioned as part of the electricity collection chamber 86 which is in the second end 94 of the second sleeve 58. These valves 52 are designed to permit removal of air from the various chambers 44,64 and 86, or to allow introduction of a gas or 5 gases into the various chambers 44,64 and 86.

Further, the interior surfaces 54 of the large light confinement chamber 44, the small light confinement chamber 64, the electricity collecting chamber 86 at the second end 94 of the second sleeve 58 and the interior of each of the three high vacuum ball valves 52 are coated with non-light absorbing materials.

Daylight that reaches the light collection disk 12 is conveyed by the individual waveguides 14 in the first array of optical waveguides 16 into the first end 18 of the first sleeve 20 where the light runs into the first polarizing lens 28 at the first end 26 of the Faraday Isolator 22.

The first polarizing lens 28 polarizes the light in a vertical plane. The vertically polarized light then passes through the Faraday Rotator 24 where the plane of polarization of the light is rotated by a specific number of horizontal angular degrees.

The second polarizing lens 32 at the second end 30 of the Faraday Isolator 22 will permit the polarized light emanating from the Faraday Rotator 24 to pass through it without further altering the polarization angle of the light. Such light as has been vertically polarized by passing through the first polarizing lens 28 and thence horizontally polarized by passing through the Faraday Rotator 24 will not be able to pass through the first polarizing lens 28 if it reenters the Faraday Rotator 24 instead of moving to and through the second polarizing lens 32 and thence through the first circular birefringent lens 34. The horizontally polarized light on passing through the first circular birefringent lens 34 will have its angle of polarization altered by a specific number of degrees. However, on passing under the influence of the first magnet 60, the polarized light will again have its angle of polarization specifically changed so as to prevent the light from reentering the first circular birefringent lens 34. The polarized light will then concentrate in the large light confinement chamber 44 but will be able to pass through the second circular birefringent lens 50 where it will enter the small light confinement chamber 64, where, under the influence of the second magnet 62, the light will have its plane of polarization altered again so as to allow the light to pass through the polarizing lens 66 in the second sleeve 58.

The polarized light will then pass into the first end 70 of the optical waveguides 74 in the second array of waveguides 72 in the second sleeve 58 and travel in each waveguide 74 to the second end 84 of each waveguide 74 where the light will enter the lenses 76 at the second end 84 of each waveguide 74 in the second array of waveguides 72 in the second sleeve 58. From the lenses 76, of each waveguide 74 in the second array of waveguides 72, the light will be focused upon specific photovoltaic cells 78 in the array of photovoltaic cells 82 in the second sleeve 58 at which time electricity will be generated in each photovoltaic cell 78 in the array of photovoltaic cells 82 in the second sleeve 58. The electricity thus generated will be collected in the electricity collection chamber 86 and thence conducted by conventional lines 90 to users.

By varying the magnetic force emanating from the magnet 62, the change in polarization angle of the polarized light in the small light confinement chamber 64 can be adjusted to prevent passage of the polarized light through the polarizing lens 66 in the second sleeve 58. In that way control over the amount of concentrated light used to generate electricity can be exercised.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents as may be resorted to, fall within the scope of the invention.

I claim:

1. A photon battery device for converting concentrated light into electricity, said photon battery device comprising:
   a daylight collection disk whence said light enters via a first array of optical waveguides into a first sleeve containing a Faraday Isolator which horizontally polarizes the entering light but prevents the light's exit in the direction from which the light entered the Faraday Isolator;
   a large light confinement chamber consisting of two halves joined together in an airtight manner having an interior with substantially all air removed therefrom and having a non-light absorbing inner surface for retaining light in said large light confinement chamber;
   a first circular birefringent lens in a first neck of the large light confinement chamber, through which the horizontally polarized light entering said large light confinement chamber from the Faraday Isolator must pass;
   a magnet lying over the first neck of said large light confinement chamber which provides a first magnetic field to which the light is exposed after entry into said large light confinement chamber;
   a small light confinement chamber in a second sleeve having an interior with substantially all air removed therefrom and having a non-light absorbing inner surface for retaining light in said small light confinement chamber;
   a second circular birefringent lens through which the light passes to reach the small light confinement chamber in a horizontally polarized condition, wherein the light subsequently has its polarization angle changed under the influence of a second magnetic field exerted in said small light confinement chamber;
   a polarizing lens in said small light confinement chamber which permits light whose polarization angle has been set under the influence of the second magnetic field to pass;
   a second array of optical waveguides in the second sleeve configured such that the light passes into a first end of each waveguide from the polarizing lens;
   wherein each waveguide in the second array of optical waveguides in the second sleeve conducts the light to a lens at a second end of each waveguide which focuses the light on a specific photovoltaic cell in an array of photovoltaic cells in the second sleeve and that situation results in generation of electricity which is collected in an electricity collection chamber at an end of the array of photovoltaic cells;
   wherein the interior of the electricity collection chamber has substantially all air removed therefrom and has a non-light absorbing inner surface for retaining light in said electricity collection chamber; and
   wherein the generated electricity is then collected and distributed to users.

2. The photon battery device of claim 1 wherein the daylight collection disk collects daylight which passes through a plurality of orifices leading to an optical waveguide at each orifice.

3. The photon battery device of claim 2 wherein each waveguide emanating from the orifices in the light collection disk conducts the captured light into the first sleeve.

4. The photon battery device of claim 1 wherein the concentrated light entering the first sleeve encounters the Faraday Isolator which polarizes the captured light, first in a vertical plane and then in a horizontal plane.

5. The photon battery device of claim 4 wherein the concentrated light which is horizontally polarized on passage through the Faraday Isolator cannot leave the first sleeve in the direction from which it entered the first sleeve but can only proceed into said large light confinement chamber by passage through said first circular birefringent lens housed in the first neck end of said large light confinement chamber.

6. The photon battery device of claim 5 wherein the horizontally polarized light, having entered the first neck at a first end of the large light confinement chamber by passage through the first circular birefringent lens, is subjected to the first magnetic field which alters the horizontal polarization angle of the light, thereby preventing the light from exiting the large light confinement chamber at the first end.

7. The photon battery device of claim 1 wherein the horizontally polarized light confined in the large light confinement chamber may exit said large light confinement chamber by passing through the second circular birefringent lens situated in a second neck at a second end of said large light confinement chamber, thence entering said small light confinement chamber.

8. The photon battery device of claim 7 wherein the horizontally polarized light on moving from the large light confinement chamber into the small light confinement chamber via passage through the second circular birefringent lens, is subjected to the second magnetic field which alters the horizontal polarization angle of the light so as to permit the light to pass through the polarizing lens at an end of the small light confinement chamber and prevent the light from reentering the large light confinement chamber.

9. The photon battery device of claim 8 wherein the second magnetic field is adjustable, allowing the horizontal polarization angle of the light to be altered such that light in the small light confinement chamber cannot pass to the second array of optical waveguides, thus providing control over the amount of electricity generated in the photon battery device.

10. The photon battery device of claim 1 wherein the large light confinement chamber, the small light confinement chamber, and the electricity collection chamber each have a high vacuum valve with a pumping means to provide a high vacuum interior with pressures in the range of $10^{-6}$ to $10^{-9}$ Torr.

11. The photon battery device of claim 1 wherein an end of the second sleeve is sealed in an airtight manner.

* * * * *